(12) United States Patent
Kageyama

(10) Patent No.: US 6,822,339 B2
(45) Date of Patent: Nov. 23, 2004

(54) SEMICONDUCTOR DEVICE (75) Inventor: Shigeki Kageyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1 day.

(21) Appl. No.: 10/167,573

(22) Filed: Jun. 13, 2002

(65) Prior Publication Data
US 2003/0137046 A1 Jul. 24, 2003

(30) Foreign Application Priority Data
Jan. 24, 2002 (JP) ........................................ 2002-015800

(51) Int. Cl.[7] .............................................. H01L 23/28
(52) U.S. Cl. ....................................................... 257/787
(58) Field of Search ........................................ 257/720

(56) References Cited

U.S. PATENT DOCUMENTS 5,796,165 A  8/1998 Yoshikawa et al.
6,512,255 B2 * 1/2003 Aoki et al. .................. 257/254
2001/0014490 A1 * 8/2001 Ida et al. ..................... 438/107
2001/0014491 A1 * 8/2001 Ohsawa ....................... 438/112

FOREIGN PATENT DOCUMENTS

| JP | 1-99227 | 4/1989 | |
| JP | 04-171970 A | * 6/1992 | .......... H01L/23/29 |
| JP | 8-321567 | 12/1996 | |
| JP | 11-54665 | 2/1999 | |

* cited by examiner

Primary Examiner—Long Pham
Assistant Examiner—Ginette Peralta
(74) Attorney, Agent, or Firm—Leydig, Voit & Mayer, Ltd.

(57) ABSTRACT

A semiconductor device includes a multiplayer substrate with a cavity, a semiconductor chip in the cavity, wiring lines with lands, a cover of a material, covering the semiconductor chip and having a protruding part, and chips bonded to the wirings lines with a solder having a low melting point. The protruding part has a height from the surface of the multiplayer substrate greater than the thickness of the wiring layer.

6 Claims, 5 Drawing Sheets

SEMICONDUCTOR DEVICE

BACKGROUND OF THE INVENTION

1. Field of the Invention

The present invention relates to a semiconductor device, a method of fabricating the semiconductor device, and a printing mask, and more particularly, to a method of printing a bonding material for bonding circuit elements of a semiconductor device to a wiring layer formed on a substrate.

2. Description of the Related Art

Use of radio frequency semiconductor chips including monolithic microwave integrated circuits (referred to as "MMIC chips") has progressively become prevalent for the miniaturization and weight-reduction of devices with the diffusion of portable personal assistants. The MMIC chip is housed in a semiconductor module or a semiconductor package. For example, when fabricating a semiconductor module including a MMIC chip, the MMIC chip is placed in a cavity in a multilayer substrate and is bonded to the multilayer substrate by die bonding, a solder cream for bonding circuit elements to a wiring layer is printed on the surface of the multilayer substrate, and circuit elements are bonded to a wiring layer on the surface of the multilayer substrate.

To fabricate a small, lightweight portable personal assistant, semiconductor chips, i.e., circuit elements, have been miniaturized to reduce the size of multilayer substrates, and areas for printed solder cream for bonding circuit elements to the wiring layer have been reduced in addition to the miniaturization of MMIC chips.

For example, semiconductor chips of the 0603 type having an area of 0.6 mm×0.3 mm in a plane have been preferred to those of the 1005 type having an area of 1.0 mm×0.5 mm in a plane.

Figure 17:
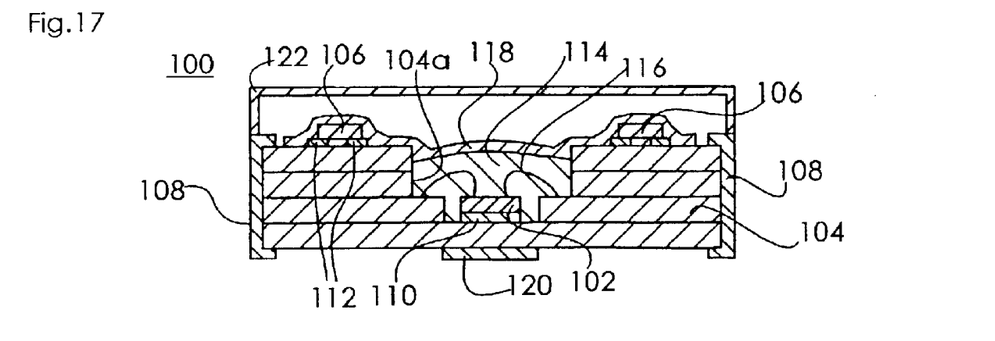
FIG. 17 is a sectional view of a prior art cavity-embedded module.

FIG. 17 is a sectional view of a prior art cavity-embedded module disclosed in Japanese Patent Laid-open No. Hei. 8-321567.

Shown in FIG. 17 are a module 100, a semiconductor chip 102, a multilayer substrate 104, a cavity 104a, chips 106, edge electrodes 108, a die-bonding layer 110, solder films 112, a potting material 114, bonding wires 116, a protective film 118, a heat-dissipating pad 120, and a metal case 122. Like or corresponding parts are denoted by the same reference characters throughout the drawings.

A method of fabricating this prior art module 100 will be described. The semiconductor chip 102 is placed in the cavity 104a of the multilayer substrate 104 and is bonded to the bottom surface of the cavity 104a. The semiconductor chip 102 is connected to wiring lines on the multilayer substrate 104 with the bonding wires 116. Then, the cavity 104a is filled with the potting material 114 and the potting material 114 is cured. The potting material 114 fills the cavity 104a so that the surface of the potting material does not protrude from the surface of the multilayer substrate 104. Subsequently, the solder films 112 for bonding the chips 106 to wiring lines on the surface of the multilayer substrate 104 are printed on the surface of the multilayer substrate 104.

Figure 18:
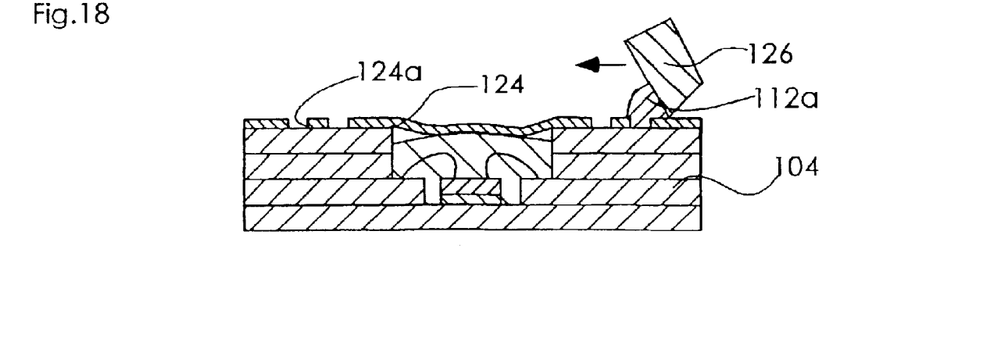
FIG. 18 is a typical sectional view of assistance in explaining a conventional printing method of printing the solder films.

FIG. 18 is a typical sectional view of assistance in explaining a conventional printing method of printing the solder films 112 on the surface of the multilayer substrate 104. Shown in FIG. 18 are a printing mask 124, openings 124a in the printing mask 124, a squeegee 126, and a solder cream 112a.

The printing mask 124 is placed on the surface of the multilayer substrate 104, the solder cream 112a is applied to the surface of the printing mask 124, and then the squeegee 126 is moved in the direction of the arrow to press the solder cream 112a into the openings 124a of the printing mask 124 to apply the solder cream in a pattern to the surface of the multilayer substrate 104. Then, the printing mask 124 is separated from the multilayer substrate 104 to form the solder films 112 on the surface of the multilayer substrate 104. Then, the chips 106 are put on the solder films 112, and the chips 106 and the solder films 112 are heated to bond the chips 106 to the wiring lines.

As chips are miniaturized progressively and chips of the 0603 type become used prevalently instead of those of the 1005 type, the area of the openings 124a of the printing mask 124 is reduced accordingly. Therefore, the solder films 112 formed on the surface of the multilayer substrate 104 by forcing the solder cream 112a into the openings 124a with the squeegee 126 adhere to the brims of the openings 124a of the printing mask 124 and come completely off the surface of the multilayer substrate 104 or come partly off the surface of the multilayer substrate 104. The amount of the solder cream 112a remaining on the surface of the multilayer substrate 104 becomes far less than that of the solder cream 112a expected to remain on the surface of the multilayer substrate 104 when the printing mask 124 is separated from the multilayer substrate 104, which causes faulty mounting of the chips 106 on the multilayer substrate 104.

Although an increase of the fluidity of the solder cream 112a will reduce the possibility of separation of the solder films 112 from the surface of the multilayer substrate 104, the adjacent solder films 112 tend to join together because the solder cream 112a is flowable and, consequently, the wiring lines are short-circuited and the yield rate of semiconductor device is reduced.

Thus solder films formed of a conventional solder cream having a low fluidity tend to be separated from the surface of the multilayer substrate 104 when the printing mask 124 is separated from the surface of the multilayer substrate 104 when the components of the semiconductor device are miniaturized and the solder films needs to be attached to parts of a small area of the surface of the multilayer substrate 104. On the other hand, solder films formed of a solder cream having a high fluidity tend to flow and are liable to short-circuit the chips. Thus, it is possible that both the solder cream having a high fluidity and the solder cream having a low fluidity cause faulty chip mounting.

A semiconductor device fabricating method disclosed in Japanese Patent Laid-open No. Hei. 11-54665 a cavity in a ceramic substrate, a semiconductor chip is placed in the cavity, the semiconductor chip is bonded to the bottom surface of the cavity, the semiconductor chip is connected to a wiring layer with bonding wires, and the semiconductor chip and the bonding wires are covered with a potting material. The potting material is below the level of the surface of the ceramic substrate by 0.2 mm or more to enable forming of the solder films on the surface of a resin substrate superposed on the ceramic substrate, by printing, and to facilitate bonding chips to a wiring layer with the solder films.

SUMMARY OF THE INVENTION

The present invention has been made to solve the foregoing problems. It is a first object of the present invention to provide a semiconductor device not causing faulty chip mounting and capable of being manufactured at a high yield rate.

According to an aspect of the invention, there is provided a semiconductor device comprising: a substrate provided with a wiring layer on its surface, and a cavity; a semiconductor chip disposed in the cavity of the substrate; a cover covering the semiconductor chip disposed in the cavity of the substrate, and provided in a part of its surface with a protrusion having a height from the surface of the substrate greater than the thickness of the wiring layer; and circuit elements bonded to the wiring layer located on the surface of the substrate by a conductive bonding material.

Accordingly, the protruding parts can be easily formed, an amount of the bonding material necessary for bonding the chips to the lands can be applied to the surfaces of the lands formed on the surface of the substrate, and hence faultily mounted circuit elements can be reduced and semiconductor devices can be manufactured at a high yield rate at low costs.

It is a second object of the present invention to provide a method of fabricating a semiconductor device not causing faulty chip mounting.

According to another aspect of the invention, there is provided a method of manufacturing a semiconductor device including: a first step of preparing a substrate provided with a wiring layer on its surface, and a cavity, and disposing a semiconductor chip in the cavity; a second step of covering the semiconductor chip disposed in the cavity of the substrate with a cover, and forming a protrusion having a height from the surface of the substrate greater than the thickness of the wiring layer in a part of the surface of the cover; and a third step of placing a printing mask for a conductive bonding material application process on the surface of the substrate, and applying a conductive bonding material through the printing mask to the wiring layer on which circuit elements are to be arranged.

Accordingly, since the printing mask slightly spaced from the surface of the substrate by the protrusions is brought into close contact with the surface of the substrate when printing the bonding material on the substrate, the printed bonding material can be prevented from separating from the substrate together with the printing mask. Therefore, the circuit elements can be surely bonded to the wiring lines, the yield rate can be improved and the highly reliable semiconductor device can be manufactured at low costs.

It is a third object of the present invention to provide a printing mask for fabricating a semiconductor device not causing faulty chip mounting.

According to a further aspect of the invention, there is provided a printing mask comprising: a masking film provided with openings through which a conductive bonding material is to be applied to a surface of a substrate; and protrusions formed in parts near the openings of the masking film of a surface of the masking film facing the substrate.

Accordingly, the bonding material can be surely printed on the surface of the substrate even if the areas of the openings of the mask body are small. Thus, the semiconductor devices can be easily manufactured at a high yield rate, using the printing mask of the present invention.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

Semiconductor devices in embodying the present invention are semiconductor modules to be used as a power amplifier for the RF unit of a portable telephone.

First Embodiment

Figure 1:
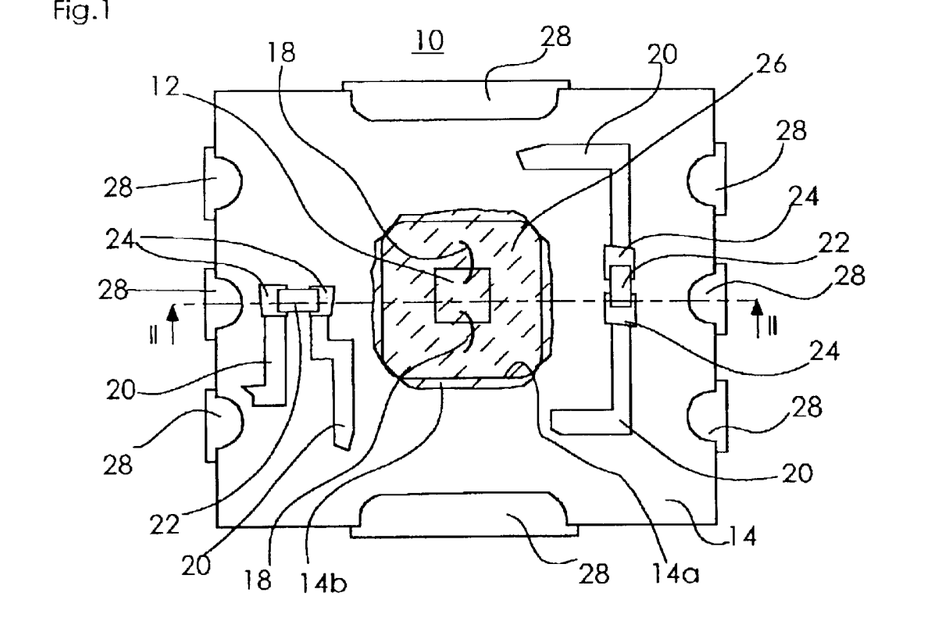
FIG. 1 is a plan view of a semiconductor device in an embodiment according to the present invention.
Figure 2:
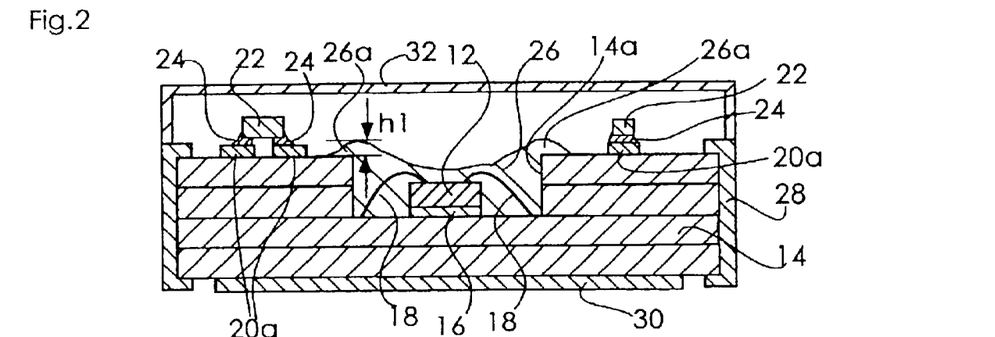
FIG. 2 is a sectional view taken on line II—II in FIG. 1.

FIG. 1 is a plan view of a semiconductor device in a first embodiment according to the present invention, and FIG. 2 is a sectional view taken on line II—II in FIG. 1.

Referring to FIGS. 1 and 2, reference numeral 10 designates a semiconductor module, which serves as a semiconductor device in the first embodiment according to the present invention, a semiconductor chip 12, and a multilayer substrate 14 of a ceramic material. The multilayer substrate 14 serving as a substrate is provided in a central part of a surface thereof with a cavity 14a. The semiconductor chip 12 is bonded to the bottom surface of the cavity 14a by die bonding using a die-bonding material, e.g., a die-bonding resin 16. Electrodes of the semiconductor chip 12 are connected to a wiring layer, not shown, formed in the cavity 14a with bonding wires 18.

Wiring lines 20 are formed on the surface of the multilayer substrate 14. Reference numeral 22 designates chips serving as circuit elements. The chips 22 are bonded to lands 20a formed in the wiring lines 20 with solder films 24 of solder having a low melting point. A solder cream 24a containing the solder having a low melting point is applied through a printing mask 40 (FIG. 3) to the lands 20a to form the solder films 24. The solder cream 24a is prepared by kneading a mixture particles of a solder alloy of about 63 parts of Sn and about 37 parts of Pb having a particle size on the order of 30 μm, and a flux.

A cover 26 is formed of a potting material prepared, for example, by mixing an epoxy resin, and a silica filler. The potting material has a coefficient of thermal expansion substantially equal to that of the semiconductor chip 12. In this embodiment, the cover 26 has a surface having a concave central part corresponding to a central part of the cavity 14a, and a protruding part 26a corresponding to the brim 14b of the cavity 14 and rising from the surface of the multilayer substrate 14. The height h1 of the protruding part 26a from the surface of the multilayer substrate 14 is greater than that of the lands 20a to which the chips 22 are bonded from the surface of the multilayer substrate 14, and is 50 μm or below.

When the chips 22 are mounted on the multilayer substrate 14 in a high packaging density, the interval between the cavity 14a and the land 20a on which the chip 22 nearest to the cavity 14a is mounted must be about 150 μm. A printing mask 40 must be placed in contact with the surface of the multilayer substrate 14 to print the solder cream 24a normally on the surface of the multilayer substrate 14. The solder cream 24a is spread over the printing mask 40, a squeegee 42 (FIG. 3), i.e., a solder cream applying tool, pressed against the printing mask 40 is moved along the surface of the printing mask 40 to print the solder cream 24a on the surface of the multilayer substrate 14. When thus pressed, the protruding part 26a of the cover 26 of the potting material, and the printing mask 40 deforms elastically, so that the printing mask 40 can be brought into contact with the surface of the multilayer substrate 14.

Factors to be considered to place the printing mask 40 in proper contact with the surface of the multilayer substrate 14 include the elastic modulus and limit of elastic deformation of the hardened cover 26, the material, thickness and elastic modulus of the printing mask 40, a material forming the squeegee 42, the pressure and moving speed of the squeegee 42, and the interval between the protruding part 26a of the cover 26 and the land 20a on which the chip 22 nearest to the protruding part 26a is mounted.

Taking those factors into consideration, it is proper that the height h1 of the protruding part 26a is 50 μm or below when the semiconductor chip 12 is sealed by the cover 26, the printing mask 40 of a stainless steel having a thickness in the range of about 50 to about 200 μm, the squeegee 42 is formed of urethane rubber having a hardness of about 90°, and the interval between the cavity 14a and the land 20a on which the chip 22 nearest to the protruding part 26a is about 150 μm.

Edge electrodes 28 are formed on the side surfaces of the multilayer substrate 14, a back electrode 30 is formed on the back surface of the multilayer substrate 14, and the surface of the multilayer substrate 14 mounted with the chips 22 is covered with a cap 32. In FIG. 1, the cap 32 is omitted.

A semiconductor device fabricating method will be described. A multilayer sheet, not shown, having a matrix of a plurality of multilayer substrates 14 similar to the foregoing multilayer substrate 14 provided with the wiring lines 20 is prepared. Semiconductor chips 12 are placed in the cavities 14a of the multilayer substrates 14 and bonded to the bottom surfaces of the cavities 14a by die bonding, and the semiconductor chips 12 are connected to wiring lines 20 with bonding wires 18, respectively. When necessary, the wiring lines 20 excluding lands 20a to which chips are to be bonded are covered with a protective film, not shown.

A potting material is poured into the cavities 14a with a pouring tool provided with a nozzle to form the covers 26 such that the semiconductor chips 12 and the bonding wires 18 are covered. Each cover 26 must be formed such that the cover 26 has a surface having a concave central part corresponding to a central part of the cavity 14a, and a protruding part 26a corresponding to the brim 14b of the cavity 14 and rising from the surface of the multilayer substrate 14 to a level above that of the wiring lines 20 formed on the surface of the multilayer substrate 14. For example, the amount of the potting material to be poured into the cavity 14a is such that the level of the potting material is equal to ¾ or above of the depth of the cavity 14a, and the amount is substantially enough to fully fill the cavity 14a or slightly less than that necessary to fully fill the cavity 14a.

The height h1 of the protruding part 26a can be adjusted by properly determining the viscosity and thixotropy of the potting material forming the cover 26, and the amount of the potting material supplied into the cavity 14a. In the first embodiment, for example, the potting material has a viscosity of 100 Pa·s or below and an index of thixotropy of 1.5 or below. When such a potting material is used, the depth of the cavity 14a is in the range of 0.3 to 0.4 mm, the height of the top surface of the die-bonded semiconductor chip 12 is 100±15 μm, and the height of the highest part of the bonding wires 18 from the top surface of the semiconductor chip 12 is 120±20 μm, the potting material must be poured into the cavity 14a so that the height of its surface from the bottom of the cavity 14a is at least in the range of 220±35 μm to cover the semiconductor chip 12 and the bonding wires 18.

Therefore, the brim 14b of the cavity 14a of the multilayer substrate 14 can be wetted with the potting material, and the potting material can be made to spread over the brim 14b of the cavity 14a to form the protruding part 26a on the brim 14b of the cavity 14a by pouring the potting material into the cavity 14a in a height from the bottom of the cavity 14a substantially equal to ¾ or above of the depth of the cavity 14a. The potting material poured into the cavity 14a is cured to complete the protruding part 26a on the brim 14b of the cavity 14a.

Figure 3:
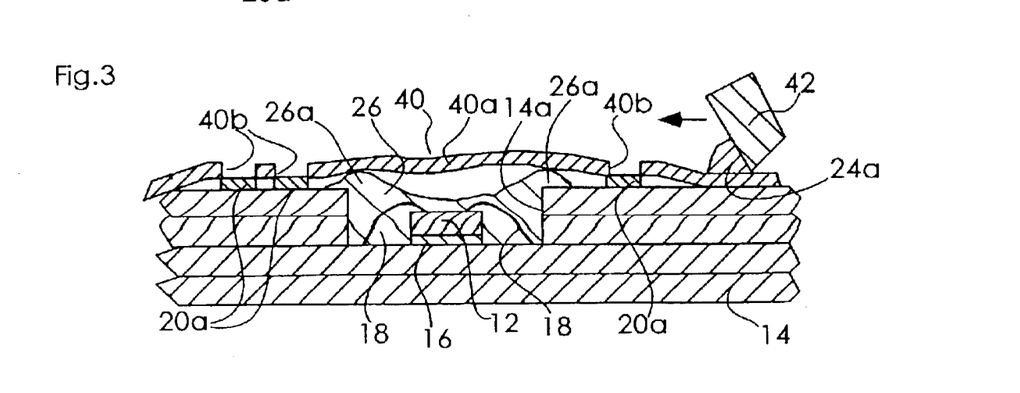
FIG. 3 is a schematic view for explaining a fabricating method of the semiconductor device according to one embodiment of the invention, showing a solder cream application process.

FIG. 3 is a schematic view for explaining a fabricating method of the semiconductor device according to one embodiment of the invention, showing a solder cream application process. In FIG. 3 and the following drawings, parts like or corresponding to those shown in FIG. 1 are denoted by the same reference characters.

Shown in FIG. 3 are the printing mask 40, a screening film 40a forming the printing mask 40, openings 40b formed in the screening film 40a, and the squeegee 42. The solder cream 24a is applied through the openings 40b to the surface of the multilayer substrate 14.

The printing mask 40 is aligned with the multilayer sheet having the plurality of multilayer substrates 14 so that the openings 40b of the printing mask 40 coincide with the lands 20a of the wiring lines 20. The solder cream 24a is applied to the printing mask 40, and the urethane rubber squeegee 42 is pressed against the solder cream 24a and is moved in the direction of the arrow shown in FIG. 3 to spread the solder cream 24a through the openings 40b over the lands 20a.

In this state, the printing mask 40 is not in close contact with the surface of the multilayer substrate 14; the printing mask 40 is in contact with the tops of the protruding parts 26a and hence a small gap is formed between the printing mask 40 and the surface of the multilayer substrate 14. When the squeegee 42 approaches the opening 40b, the protruding part 26a of the cover 26 and the printing mask 40 are deformed elastically by the pressure applied thereto by the squeegee 42 and, consequently, parts of the printing mask 40 depressed by the squeegee 42 are brought into close contact with the surface of the multilayer substrate 14. The solder cream 24a pushed by the squeegee 42 is applied through the opening 40b to the surface of the land 20a with the printing mask 40 in close contact with the surface of the multilayer substrate 14.

Parts of the printing mask 40 start separating from the surface of the multilayer substrate 14 immediately after the straight edge, where the pressure exerted by the squeegee 42 on the printing mask 40 is the highest, of the squeegee 42 has passed those parts. However, the squeegee 42 presses down the solder cream 24a as long as the same is moving over the opening 40b even after the straight edge of the squeegee 42 has passed the opening 40b. Thus, the solder cream 24a applied to the land 20a is restrained from separating from the surface of the land 20a together with the printing mask 40. After thus applying the solder cream 24a to the lands 20a, the printing mask 40 is separated from the multilayer sheet. Then, the chips 22 are put on the lands 20a coated with the solder cream 24a, the chips 22 and the solder cream 24a are heated to bond the chips 22 to the lands 20a with the solder films 24 of the solder having a low melting point. Then, the multilayer sheet is divided into individual multilayer substrates 14 to provide modules 10.

The solder cream 24a which is a mixture of spherical particles of an alloy of Sn and Pb having a particle size on the order of 30 μm, and a flux, is not only simply viscous but also thixotropic. Usually the degree of thixotropy is represented by an index of thixotropy. A method of measuring the thixotropy of a substance measures a torque Ta necessary for rotating the rotor of a rotational viscometer at a low rotating speed to stir a sample of the substance, and then measures a torque Tb necessary for rotating the rotor of the rotational viscometer at a high rotating speed to stir the sample. The index of thixotropy is represented by the ratio Ta/Tb. Incidentally, Ta=Tb for water and hence the index of thixotropy of water is 1.

It is considered that the torque Ta at the low rotating speed corresponds to the viscosity of the sample in a substantially static state, i.e., static viscosity, and the torque Tb at the high rotating speed corresponds to the viscosity of the sample in a flowing state, i.e., kinematic viscosity. It is considered that a property tending to maintain a static state augments with the increase of the index of thixotropy from 1

When a solder cream 24a having the same thixotropy as that of a solder cream for bonding chips 22 of the 1005 type to the lands 20a is used for bonding chips 22 of the 0603 type to the lands 20a and the solder cream 24a is applied to the lands 20a by a conventional printing method, the area of parts to be bonded to the lands 20a of the chips 22 of the 0603 type is small and the amount of the solder cream 24a necessary for bonding each chip 22 to each land 20a is small. Therefore, the weight and the adhesion to the surface of the land 22a of the solder film 24 of the solder cream 24a is small as compared with those of the solder film 24 for bonding the chips of the 1005 type to the lands 22a.

When a solder cream having a thixotropic characteristic similar to that of a solder cream for forming solder films for bonding chips of the 1005 type to the lands is printed by a conventional printing method, the weight and the adhesion to the surface of the land of the printed solder film becomes lower than a force necessary for separating the solder film from the printing mask due to the thixotropic characteristic of the solder film to maintain its static state, i.e., a state in which the solder film is adhering to the printing mask, so that the printed solder film is separated from the surface of the lands together with the printing mask or the amount of the solder cream remaining on the land decreases.

The method of fabricating the module 10 forms the cover 26 of the potting material having the protruding part 26a corresponding to the brim 14b of the cavity 14a, and includes the printing process of forming the solder films 24 of the solder cream 24a on the lands 20a of the wiring lines 20 by elastically deforming the protruding parts 26a and the printing mask 40 by pressure applied thereto by the squeegee 42 to bring the printing mask 40 into close contact with the surface of the multilayer substrate 14 and applying the solder cream 24a to the lands 20a of the wiring lines 20. The squeegee 42 presses down the solder cream 24a for a while after the protruding parts 26a have recovers to some extent from elastic deformation and parts of the printing mask 40 have started separating from the surface of the multilayer substrate 14.

Thus, the squeegee 42 presses down the solder cream 24a instead of leaving the solder cream 24a adhering to the brims of the openings 40b formed in the screening film 40a to separate the solder cream 24a from the printing mask 40 so that the printed solder films 24 remains on the lands 20a of the wiring lines 20. Therefore, even if the area of the printed solder films 24 of the solder cream 24a is small, and the adhesion of the solder films 24 to the lands 20a is lower than a force necessary for separating the solder films 24 from the printing mask 40, the solder films 24 will not come off the lands 20a together with the printing mask 40 when the printing mask 40 is separated from the surface of the multilayer substrate 14 and the undesirable reduction of the amount of the solder cream 24a forming the solder films 24 can be suppressed.

Thus, even if the chips 22 are miniaturized and the lands 20a for the chips 22 have a small area, a predetermined amount of the solder cream 24a can be applied to and held on each of the lands 20a without reducing the viscosity of the solder cream 24a. Accordingly, the joining of the adjacent solder films liable to occur when a solder cream having a high fluidity is used for forming the solder films, and the faulty bonding of the chips 22 to the lands 20a can be easily prevented and, consequently, highly reliable modules can be manufactured at low costs.

In the module 10, the faulty bonding of the chips 22 to the lands 20a can be prevented by the simple cover 26 of the potting material having the protruding part 26a corresponding to the brim 14 of the cavity 14a. Thus, the highly reliable module 10 can be manufactured at a high yield rate.

Second Embodiment

Figure 4:
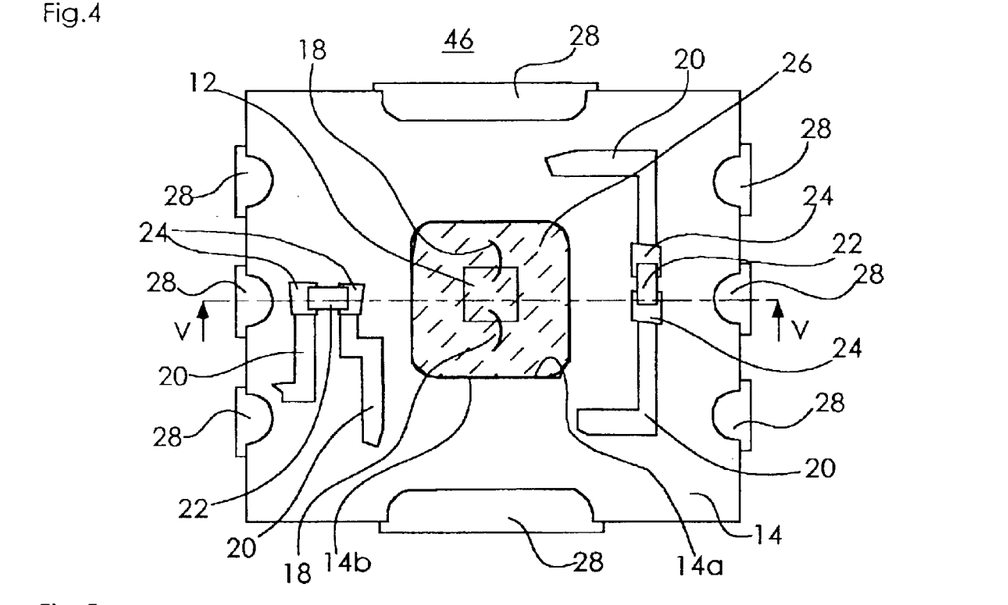
FIG. 4 is a plan view of a semiconductor device in one embodiment according to the present invention.
Figure 5:
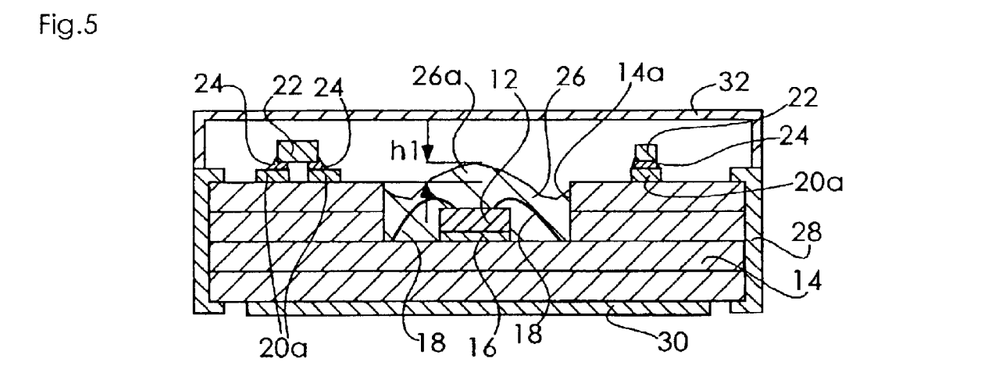
FIG. 5 is a sectional view taken on line V—V in FIG. 4.

FIG. 4 is a plan view of a semiconductor device in a second embodiment according to the present invention, and FIG. 5 is a sectional view taken on line V—V in FIG. 4. FIG. 4 shows a module 46 in the second embodiment.

Whereas the cover 26 of the potting material has the protruding part 26a formed on the brim 14b of the cavity 14a in the first embodiment, a cover 26 has a protruding part 26a in its central part corresponding to a central part of a cavity 14a in the second embodiment.

Referring to FIGS. 4 and 5, the cover 26 of the potting material is formed only in the cavity 14a and does not have any part extending beyond the brim 14b of the cavity 14a. As shown in FIG. 5, the protruding part 26a of the cover 26 has a peak at a position corresponding to a central part of the cavity 14a. The height h1 of the protruding part 26a from the surface of a multilayer substrate 14 is greater than the thickness of a wiring layer formed on the surface of the multilayer substrate 14 and about 100 µm or below.

The height of the protruding part 26a is dependent on the shape of the cavity 14a in a plane. For example, when the cavity 14a is 2 mm×2 mm in size in a plane, the interval between the position at the peak of the protruding part 26a and the brim 14b of the cavity 14a must be, for example, about 1 mm, and the interval between the brim 14b of the cavity 14a and a land 20a for a chip 22 nearest to the brim 14b of the cavity 14a must be about 150 µm.

Conditions for bringing a printing mask 40 into proper contact with the surface of the multilayer substrate 14 are the same as those mentioned in the description of the first embodiment. The distance between the peak of the protruding part 26a and the land 20a for the chip 22 nearest to the brim 14b of the cavity 14a is longer than that in the first embodiment by the distance between the peak of the protruding part 26a and the brim 14b of the cavity 14a, such as about 1 mm. Therefore, the printing mask 40 can be brought into close contact with a part around the land 20a of the surface of the multilayer substrate 14 even if the height of the protruding part 26a is greater than that of the protruding part 26a of the first embodiment.

Therefore, the range of the height of the protruding part 26a, as compared with that of the height of the protruding part of the first embodiment, is wide and the dimensional accuracy of the protruding part 26a may be lower than that of the protruding part 26a of the first embodiment, and hence the range of the height of the protruding part 26a, which affects the printing of a solder cream, may be wider and the yield rate of the module is improved.

A method of fabricating the module 46 in the second embodiment is similar to that of fabricating the module 10 in the first embodiment. Although the potting material for forming the cover 26 is a mixture of an epoxy resin and a silica filler, which is the same as the potting material used in fabricating the module 10 in the first embodiment, the potting material used for fabricating the module 46 in the second embodiment has a viscosity and an index of thixotropy higher than those of the potting material used for fabricating the module 10 in the first embodiment. For example, a potting material for forming the cover 26 of the second embodiment has a viscosity exceeding 100 Pa·s and an index of thixotropy greater than 1.5.

The potting material is poured into the cavity 14a to form the cover 26 such that a semiconductor chip 12 placed in the cavity 14a and bonding wires 18 are covered, and the level of the potting material for forming the cover 26 is about ¾ or above of the depth of the cavity 14a. At the last stage of pouring the potting material into the cavity 14a, the nozzle of a pouring tool is moved to a position corresponding to a central part of the cavity in which the protruding part 26a is to be formed and the potting material is poured to form the protruding part 26a.

The protruding part 26a formed of the potting material having a viscosity exceeding 100 Pa·s and an index of thixotropy greater than 1.5 is capable of maintaining its shape. The cover 26 thus formed is completed by curing. Since the cover 26 can be comparatively easily maintained in a desired shape, the height of the protruding part 26a is easy to adjust.

A printing process of printing the solder cream 24a is the same as that mentioned in the description of the first embodiment. The printing mask 40 is placed on the surface of the multilayer substrate 14 in contact with the peak of the protruding part 26a so that a small gap is formed between the printing mask 40 and the surface of the multilayer substrate 14. When a squeegee 42 approaches an opening 40b of the printing mask 40, the protruding part 26a of the cover 26 and the printing mask 40 are deformed elastically by the pressure applied thereto by the squeegee 42 and, consequently, parts of the printing mask 40 depressed by the squeegee 42 are brought into close contact with the surface of the multilayer substrate 14. The solder cream 24a pushed by the squeegee 42 is applied through the opening 40b to the surface of the land 20a with the printing mask 40 in close contact with the surface of the multilayer substrate 14.

Parts of the printing mask 40 start separating from the surface of the multilayer substrate 14 immediately after the straight edge, which exerts the highest pressure on the printing mask 40, of the squeegee 42 has passed those parts. However, the squeegee 42 presses down the solder cream 24a as long as the same is moving over the opening 40b even after the straight edge of the squeegee 42 has passed the opening 40b. Thus, the solder cream 24a applied to the land 20a is restrained from separating from the surface of the land 20a together with the printing mask 40.

The effect of the method of fabricating the module 46 in the second embodiment is the same as that of the method of fabricating the module 10 in the first embodiment, the range of allowable values of the height of the protruding part 26a is wide, and the dimensional accuracy of the protruding part 26a is not very severe, and hence the dimension management of module fabricating processes is simple. Thus, the undesired connection of the adjacent solder films, and the faulty bonding of the chip 22 to the lands 20a due to insufficiency of the amount of the solder films formed on the lands 20a can be prevented and, therefore, highly reliable modules can be manufactured at low costs. The module 46, similarly to the module 10, is highly reliable and can be manufactured at a high yield rate.

Third Embodiment

Figure 6:
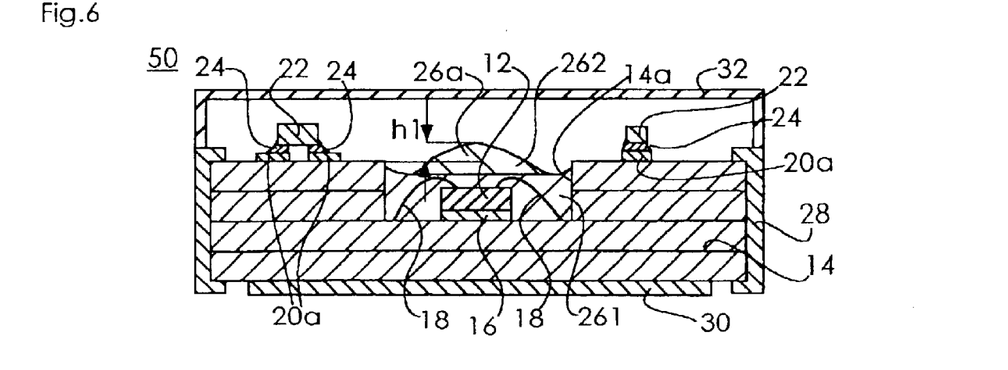
FIG. 6 is a sectional view of a semiconductor device in one embodiment according to the present invention.

FIG. 6 is a sectional view of a semiconductor device in a third embodiment according to the present invention. In FIG. 6, indicated at 50 is a module in a third embodiment according to the present invention. A cover has a base cover layer 261, serving as a base part, formed of a first potting material having a low viscosity, and a top cover layer 262, serving as a upper part, formed of a second potting material having a high viscosity.

Referring to FIG. 6, the first potting material forming the base cover layer 261 is a mixture of an epoxy resin and a silica filler, which is the same as the potting material used in fabricating the module 10 in the first embodiment, having, for example, a viscosity of 100 Pa·s or below, and an index of thixotropy of 1.5 or below. The second potting material forming the top cover layer 262 is a mixture of an epoxy resin and a silica filler, which is the same as the potting material used in fabricating the module 46 in the second embodiment, having, for example, a viscosity exceeding 100 Pa·s, and an index of thixotropy exceeding 1.5.

A semiconductor chip 12 placed in a cavity 14a formed in a multilayer substrate 14, and bonding wires 18 connecting the semiconductor chip 12 to a wiring layer are covered with the base cover layer 261. The base cover layer 261 has a flat surface at a level below a plane including the surface of the multilayer substrate 14. The top cover layer 262 formed on the base cover layer 261 has a protruding part 26a formed in a central part of the cavity 14a. The height of the protruding part 26a from the surface of the multilayer substrate 14 is, similarly to that of the protruding part 26a of the second embodiment, is greater than the thickness of a wiring layer formed on the surface of the multilayer substrate 14 and about 100 µm or below.

Although a method of fabricating the module 50 is substantially the same as those of fabricating the modules in the first and the second embodiment, the method differs from those of fabricating the modules in the first and the second embodiment in a covering process of covering the semiconductor chip 12 and the bonding wires 18 with the base covering part 261 and the top covering part 262. The covering process forms the base cover layer 261 by pouring the low-viscosity first potting material in the cavity 14a till the low-viscosity first potting material just covers the semiconductor chip 12 and the bonding wires 18. The base cover layer 261 does not necessarily cover the semiconductor chip 12 and the bonding wires 18 completely. The low-viscosity first potting material is able to spread and reach the four corners of the cavity 14a in a short time, and enables bubbles formed therein to disappear easily. Thus, the base cover layer 261 covers the semiconductor chip 12 and the bonding wires 18 effectively.

Subsequently, a pouring tool provided with a nozzle for pouring the high-viscosity second potting material is disposed with the nozzle located in a central part of the cavity 14a in which the protruding part 26a is to be formed, and the high-viscosity second potting material is poured into the cavity 14a to form the top cover layer 262 having the protruding part 26a. Then, a curing process is executed to complete the base cover layer 261 and the top cover layer 262 by curing the low-viscosity potting material and the high-viscosity potting material poured into the cavity 14a. The curing process may be executed after the low-viscosity potting material has been poured into the cavity 14a before pouring the high-viscosity potting material into the cavity 14a. The curing process may be simply a process of volatilizing the solvents of the potting materials.

Subsequently, a printing process similar to that of fabricating the module 46 in the second embodiment is executed.

The range of the height of the protruding part 26a of the module 50 in the third embodiment, similarly to that of the height of the protruding part 26a of the module 46 in the second embodiment, is wide and the dimensional accuracy of the protruding part 26a may be lower than that of the protruding part 26a of the first embodiment, and hence the range of the height of the protruding part 26a, which affects the printing of a solder cream, may be wide and the yield rate of the module 50 is improved.

In the module 50 in the third embodiment, the semiconductor chip 12 and the bonding wires 18 can be effectively covered with the base cover layer of the low-viscosity potting material, and the high-viscosity potting material forming the protruding part 26a of the top cover layer 262 facilitates forming the protruding part 26a in a desired height, and enables forming the protruding part 26a in a height in a narrow range.

Thus, the cover consisting of the base cover layer 261 and the top cover layer 262 of the module 50 in the third embodiment is highly reliable, the respective heights of the protruding parts 26a fall in a narrow range, and the range of the height of the protruding part 26a of the module 50 in the third embodiment is wide. Therefore, the printing process of printing a solder cream is able to secure an amount of the solder cream sufficient for satisfactorily bonding a chip 22 to a land formed in a wiring line, so that faulty bonding of the chips 22 to the lands due to the insufficient amount of the solder cream forming the solder films can be prevented and, consequently, highly reliable modules can be manufactured at low costs.

A method of fabricating the module 50 in the third embodiment is able to cover the semiconductor chip 12 and the bonding wires 18 satisfactorily because the low-viscosity first potting material has a high fluidity, is able to spread and reach the four corners of the cavity 14a in a short time, and enables bubbles formed therein to disappear easily. Thus, the base cover layer 261 covers the semiconductor chip 12 and the bonding wires 18 effectively. The high-viscosity second potting material is poured into the cavity 14a to form the top cover layer 262 having the protruding part 26a. The high-viscosity second potting material facilitates forming the protruding parts 26a in heights in a narrow range. Thus, the semiconductor chip 12 and the bonding wires 18 can be effectively covered in a short time and the protruding parts 26a can be formed respectively in heights in a narrow range, and faulty bonding of the chips 22 to the lands due to insufficiency in the amount of the solder cream forming the solder films can be prevented by a simple process and hence highly reliable modules can be manufactured at low costs.

Fourth Embodiment

Figure 7:
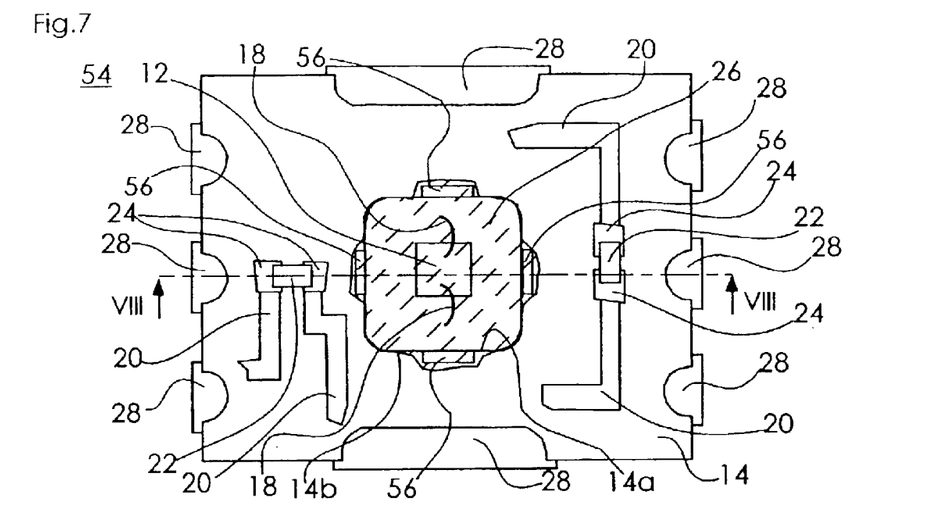
FIG. 7 is a plan view of a semiconductor device in one embodiment according to the present invention.
Figure 8:
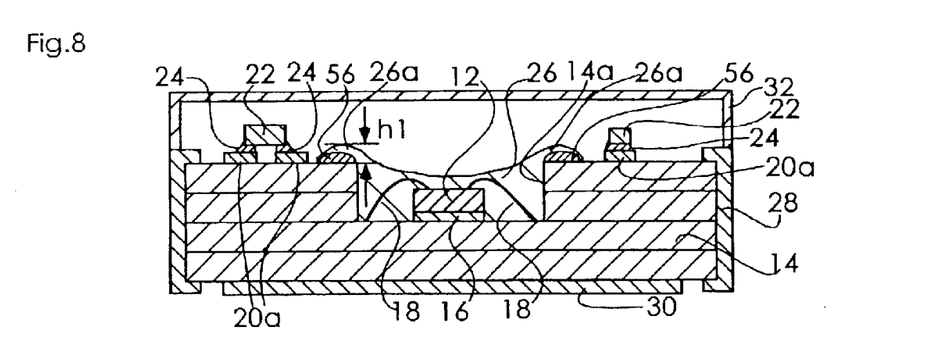
FIG. 8 is a sectional view taken on line VIII—VIII in FIG. 7.

FIG. 7 is a plan view of a semiconductor device in a fourth embodiment according to the present invention, and FIG. 8 is a sectional view taken on line VIII—VIII in FIG. 7. In FIGS. 7 and 8, indicated at 54 is a module in the fourth embodiment, and at 56 is a protrusion, serving as a second protrusion, formed of a material for forming a protective film. The module 54 has the protrusion 56 formed on the brim 14b of a cavity 14 formed in a multilayer substrate 14. The protrusion 56 is formed simultaneously with a glass protective film, i.e., an overcoat, for covering wiring lines 20.

The multilayer substrate 14 is formed of a ceramic material and has a comparatively rough surface and hence the surface of the multilayer substrate 14 has a low wettability. Therefore, sometimes, a potting material has difficulty in flowing and spreading over the brim 14b of the cavity 14a when the potting material is poured into the cavity 14a to form a protruding part on the brim 14b of the cavity 14a, and is unable to spread uniformly. Therefore, the protrusion 56 is formed of a glass material, which is expected to form a surface smoother than that of the ceramic multilayer substrate 14, on the brim 14b of the cavity 14a.

The protrusion 56 formed of a glass material and having a smooth surface has a high wettability to a potting material for forming a cover 26. When the potting material is poured into the cavity 14a to form the cover 26 such that a semiconductor chip 12 placed in the cavity 14a and bonding wires 18 are covered, and the level of the potting material to form the cover 26 is about ¾ or above of the depth of the cavity 14a, the potting material wets the protrusion 56, spreads through the brim 14b of the cavity 14a, and covers the protrusion 56 to form a protruding part 26a. Since the surface of the protrusion 56 is wettable with the potting material, the potting material spreads uniformly over the protrusion 56, and the position and height of the protruding part 26a can be easily adjusted.

Since the position of the protruding part 26a is easily adjustable, the possibility of undesirably covering lands 20a formed in wiring lines 20 extending in the vicinity of the cavity 14a with the potting material spreading beyond the brim 14b of the cavity 14a can be reduced.

Subsequently, a printing process similar to that of fabricating the module 10 in the first embodiment is executed.

A method of fabricating the semiconductor device in the fourth embodiment forms the protrusion 56 having a surface smoother than the surface of the multilayer substrate 14 on the brim 14b of the cavity 14a to facilitate the adjustment of the position and height of the protruding part 26a of the potting material. Consequently, a solder cream can be properly applied to the lands 20a by the printing process, so that faulty bonding of chips 22 to the lands 22a due to the insufficient amount of the solder cream forming the solder films can be prevented and, highly reliable modules can be manufactured at low costs.

Fifth Embodiment

Figure 9:
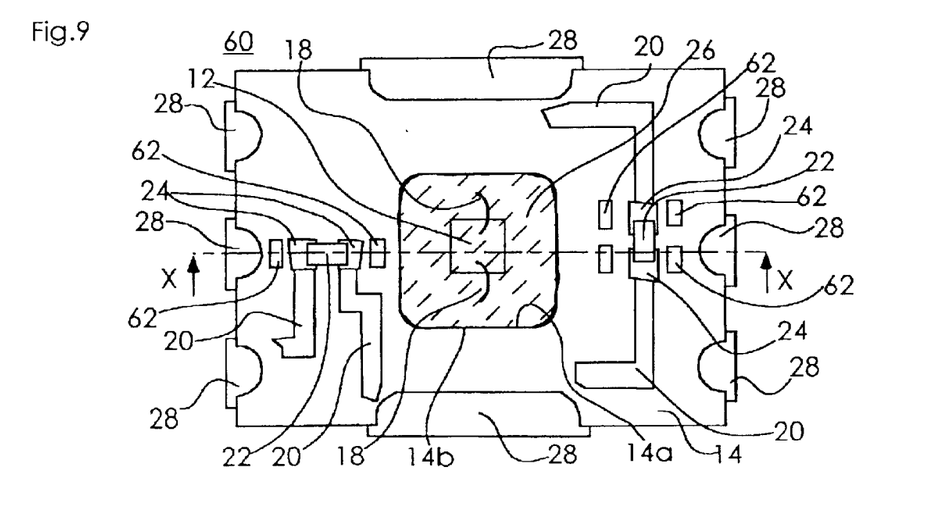
FIG. 9 is a plan view of a semiconductor device in one embodiment according to the present invention.
Figure 10:
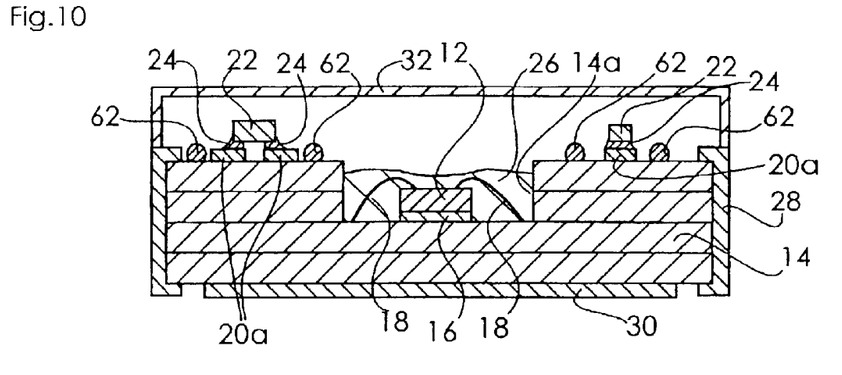
FIG. 10 is a sectional view taken on line X—X in FIG. 9.

FIG. 9 is a plan view of a semiconductor device in a fifth embodiment according to the present invention, and FIG. 10 is a sectional view taken on line X—X in FIG. 9. In FIGS. 9 and 10, indicated at 60 is a module in the fifth embodiment and at 62 are protrusions. The module 60 is not provided with any parts corresponding to the foregoing protruding parts 26a of the potting material. The protrusions 62 formed near lands 20a on the surface of a multilayer substrate 14 exercises the function of the protruding parts 26a.

When the multilayer substrate 14 is formed of a ceramic material, the protrusions 62 can be formed in a predetermined thickness on the surface of the multilayer substrate 14, for example, by repeating a printing process of printing a conductive paste and a drying process of drying the printed conductive paste. The protrusion of a glass coating material can be formed by repeating a printing process of printing the glass coating material and a drying process of drying the printed glass coating material. Both a conductive paste and a glass coating material may be used in combination to form protrusions. The protrusions 62 may be formed by using a compression mold provided with cavities at predetermined positions for forming the laminated multilayer substrate. When the multilayer substrate is formed of an organic material, the protrusions of a predetermined thickness may be formed by using a thick solder resist, and a solder resist and a conductive pattern may be formed in combination. The protrusions may be formed by applying a resin to desired parts of the substrate and hardening the resin applied to the substrate by a module fabricating process.

The height of the protrusions 62 from the surface of the multilayer substrate 14 is dependent on the distance from the nearby lands 20a. Since the elastic deformation of the protrusions 62 when the same are depressed by a squeegee is not much expectable, the height of the protrusions 62 must be lower than those of the protruding parts 26a of the modules in the first to the fourth embodiment. Therefore, the proper height of the protrusions 62 from the surface of the multilayer substrate 14 is greater than the thickness of wiring lines formed on the surface of the multilayer substrate 14 and 30 µm or below.

In a printing process, a printing mask 40 is placed on the multilayer substrate 14 in contact with the tops of the protrusions 62, so that a small gap is formed between the surface of the multilayer substrate 14 and the printing mask 40, and the printing mask 40 is not in close contact with the surface of the multilayer substrate 14. Although the protrusion 26 does not undergo significant elastic deformation when a squeegee 42 approaches an opening 40b corresponding to a land 20a, the printing mask 40 undergoes elastic deformation and a part of the printing mask 40 depressed by the squeegee 42 is brought into close contact with the surface of the multilayer substrate 14. Thus, a solder cream 24a forced into the opening 40b by the squeegee 42 is applied to the surface of the land 20a corresponding to the opening 40b with the printing mask 40 pressed in close contact with the surface of the multilayer substrate 14.

Parts of the printing mask 40 start separating from the surface of the multilayer substrate 14 immediately after the straight edge, which exerts the highest pressure on the printing mask 40, of the squeegee 42 has passed those parts. However, the squeegee 42 presses down the solder cream 24a as long as the same is moving over the opening 40b even after the straight edge of the squeegee 42 has passed the opening 40b. Thus, the solder cream 24a applied to the land 20a is restrained from separating from the surface of the land 20a together with the printing mask 40.

The protrusions 62 of the module 60 in the fifth embodiment are substantially the same in function and effect as the protruding parts 26a of the module 10 in the first embodiment. Since the protrusions 62 of the module 60 are not formed of a potting material, the protrusions 62 can be at any optional positions on the surface of the multilayer substrate 14, which enhances the degree of freedom of determining the positions of lands 20a to be coated with the solder cream 24a, and the degree of freedom of designing the arrangement of the wiring lines 20. Thus, modules having satisfactory electrical characteristics can be fabricated.

Sixth Embodiment

Figure 11:
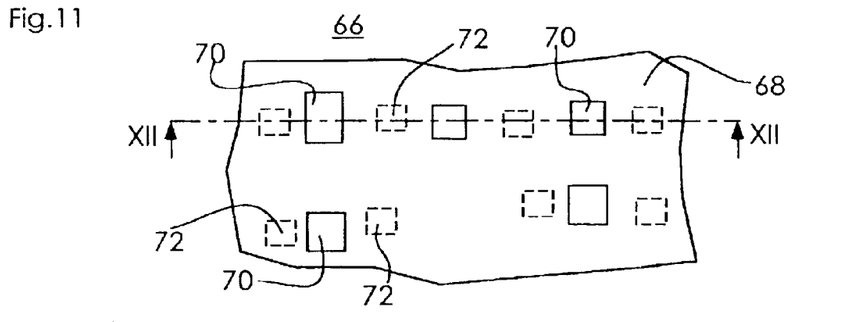
FIG. 11 is a fragmentary plan view of a printing mask in one embodiment according to the present invention.
Figure 12:
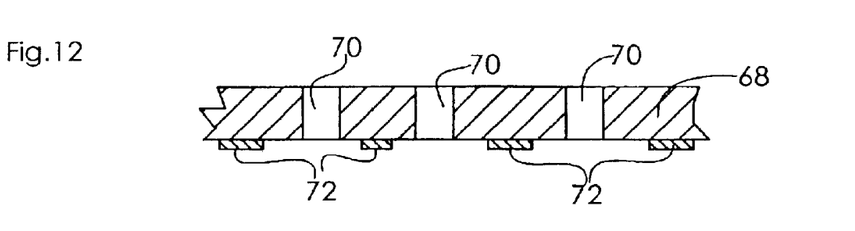
FIG. 12 is a sectional view taken on line XII—XII in FIG. 11.

FIG. 11 is a fragmentary plan view of a printing mask in a sixth embodiment according to the present invention, and FIG. 12 is a sectional view taken on line XII—XII in FIG. 11. Shown in FIGS. 11 and 12 is a printing mask 66 having a mask body 68 formed of a stainless steel and having a thickness in the range of about 50 to abut 200 µm. The mask body 68 is provided with openings 70 corresponding to lands 20a to which chips 22 are to be bonded. Protrusions 72 are formed of, for example, a resin at positions near the openings 70 on a surface, which is to face a multilayer substrate 14, of the mask body 68. The thickness, which is dependent on the distance between the protrusions 72 and the corresponding openings 70, is greater than the thickness of wiring lines 20 and about 30 µm or below.

When a solder cream 24a is printed on the multilayer substrate 14 through the printing mask 66, the protrusions 72 of the printing mask 66 are brought into contact with the surface of the multilayer substrate 14 to form a small gap between the multiplayer substrate 14 and the mask body 68, and hence the printing mask 66 is not in close contact with the multilayer substrate 14. Although the protrusion 72 does not undergo significant elastic deformation when a squeegee 42 approaches the opening 70, the mask body 68 undergoes elastic deformation and a part of the mask body 68 depressed by the squeegee 42 is brought into close contact with the surface of the multilayer substrate 14. Thus, the solder cream 24a forced into the opening 70 by the squeegee 42 is applied to the surface of the land 20a corresponding to the opening 70 with the mask body 68 pressed in close contact with the surface of the multilayer substrate 14.

Parts around the opening 70 of the mask body 68 start separating from the surface of the multilayer substrate 14 immediately after the straight edge, where the pressure exerted by the squeegee 42 on the mask body 68 is the highest, of the squeegee 42 has passed the opening 70. However, the squeegee 42 presses down the solder cream 24a as long as the same is moving over the opening 70 even after the straight edge of the squeegee 42 has passed the opening 70. Thus, the solder cream 24a applied to the land 20a is restrained from separating from the surface of the land 20a together with the printing mask 66.

Even if the chip 22 is small and the lands 20a have a small area accordingly, a predetermined amount of the solder cream 24a can be applied to each land 20a by using the printing mask 66 without reducing the viscosity of the solder cream 24a. Thus, the solder cream 24a of an amount necessary for bonding the chip 22 to the land 20a can be surely applied to the land 20a.

Accordingly, the undesirable joining of the adjacent solder films liable to occur when a solder cream having a low viscosity is used for forming the solder films, and the faulty bonding of the chips 22 to the lands 20a can be prevented without changing processes and, consequently, highly reliable modules can be manufactured at low costs.

Figure 13:
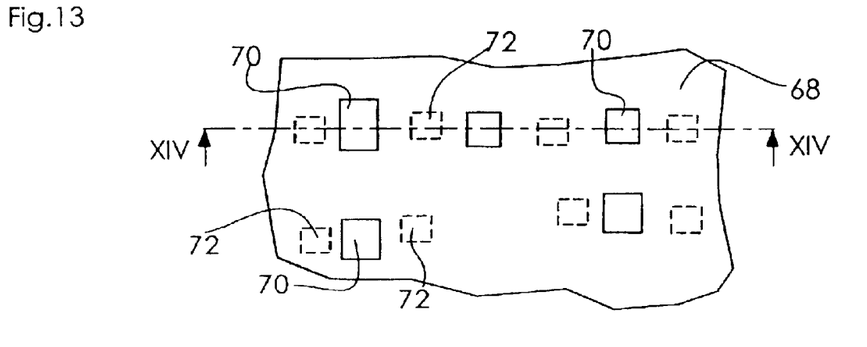
FIG. 13 is a fragmentary plan view of a printing mask in a modification of the printing mask according to the present invention.
Figure 14:
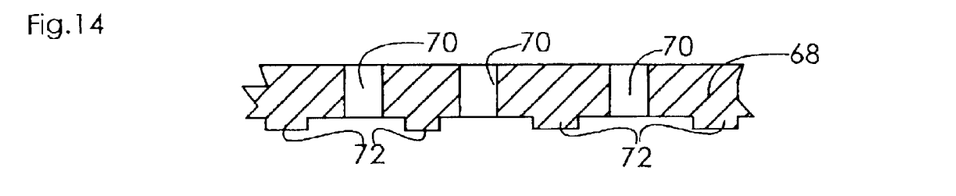
FIG. 14 is a sectional view taken on line XIV—XIV in FIG. 13.
Figure 15:
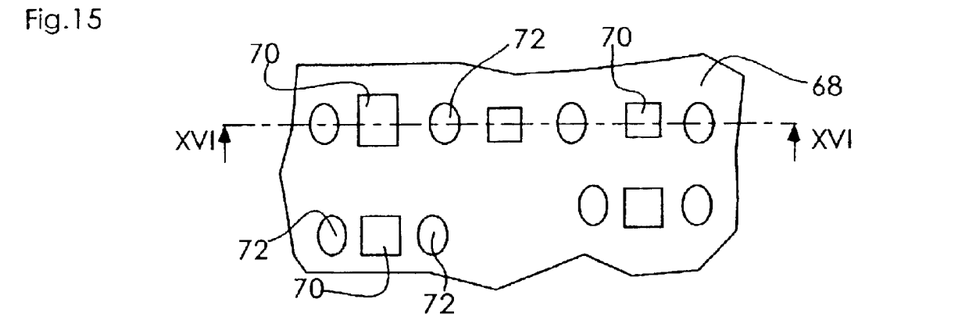
FIG. 15 is a fragmentary plan view of a printing mask in a modification of the printing mask according to the present invention.
Figure 16:
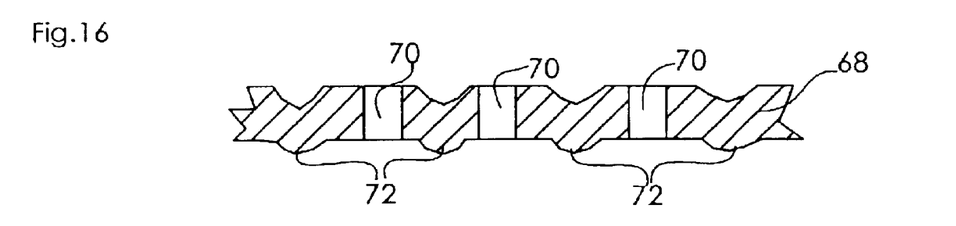
FIG. 16 is a sectional view taken on line XVI—XVI in FIG. 15.

FIG. 13 is a fragmentary plan view of a printing mask in a first modification of the printing mask in the sixth embodiment, FIG. 14 is a sectional view taken on line XIV—XIV in FIG. 13, FIG. 15 is a fragmentary plan view of a printing mask in a second modification of the printing mask in the sixth embodiment, and FIG. 16 is a sectional view taken on line XVI—XVI in FIG. 15.

As shown in FIGS. 13 and 14, a printing mask in the first modification has a mask body 68 integrally provided with protrusions 68 protruding from one surface thereof which is to face a multilayer substrate 14.

As shown in FIGS. 15 and 16, a printing mask in the second modification has a mask body 68 integrally provided with protrusions 72 protruding from one surface thereof which is to face a multilayer substrate 14. The protrusions 72 are formed through the plastic deformation of parts of the mask body 68.

Although the use of the solder cream has been described in connection with the description of the first to the sixth embodiment, the present invention exercises the same effect with the use of a resin adhesive containing a conductive filler.

The semiconductor device, the method of fabricating the semiconductor device and the printing mask according to the present invention have the following advantageous effects.

The semiconductor device according to the present invention comprises: a substrate provided with a wiring layer on its surface, and a cavity; a semiconductor chip disposed in the cavity of the substrate; a cover covering the semiconductor chip disposed in the cavity of the substrate, and provided in a part of its surface with a protrusion having a height from the surface of the substrate greater than the thickness of the wiring layer; and circuit elements bonded to the wiring layer located on the surface of the substrate by a conductive bonding material.

Accordingly, the protruding parts can be easily formed, an amount of the bonding material necessary for bonding the chips to the lands can be applied to the surfaces of the lands formed on the surface of the substrate, and hence faultily mounted circuit elements can be reduced and semiconductor devices can be manufactured at a high yield rate at low costs.

Further, the protrusion is located at a part near the brim of the cavity of the substrate.

Accordingly, the semiconductor chips can be effectively covered and hence the semiconductor devices are highly reliable.

Furthermore, the semiconductor device comprises a second protrusion having a surface smoother than the surface of the substrate, and located on the surface of the substrate at a part near the brim of the cavity of the substrate.

Accordingly, the wettability of the cover can be improved, the protrusion of the cover can be easily formed, and the height and the position of the protrusion can be easily adjusted. Thus, the protrusion can be properly formed, and the bonding material can be properly printed. Therefore, faultily mounted circuit elements can be further reduced and the semiconductor devices can be manufactured at a high yield rate.

Still further, the protrusion is located in a central part of the cavity of the substrate.

Accordingly, the protrusion can be formed in a comparatively big height, and hence the bonding material can be satisfactorily printed even if the respective heights of the protrusions are distributed in a certain range. Thus, faultily mounted circuit chips can be reduced and the semiconductor devices can be manufactured at a high yield rate.

Still further, the cover has a base part formed of a first potting material, and an upper part formed of a second potting material, and the protrusion is formed of the second potting material forming the upper part.

Accordingly, the first and the second potting material respectively having different fluidities can be used, the semiconductor chip can be effectively covered with the first potting material, and the second potting material facilitates the adjustment of the height of the protrusion. Thus, the highly reliable semiconductor device can be manufactured at a high yield rate.

Further, the semiconductor device according to the present invention comprises: a substrate provided with a wiring layer on its surface, and a cavity; a semiconductor chip disposed in the cavity of the substrate; a cover covering the semiconductor chip disposed in the cavity of the substrate; circuit elements bonded to the wiring layer formed on the surface of the substrate by a conductive bonding material; and a protrusion formed in a part of the surface of the substrate in the vicinity of the wiring layer on which the circuit elements are disposed, and having a height from the surface of the substrate greater than the thickness of the wiring layer.

Accordingly, since the protrusion can be formed near the land to which the bonding material is to be applied regardless of the position of the cavity, the degree of freedom of designing the wiring layer can be increased and hence the semiconductor device has satisfactory electrical characteristics.

A semiconductor device fabricating method according to the present invention includes: a first step of preparing a substrate provided with a wiring layer on its surface, and a cavity, and disposing a semiconductor chip in the cavity; a second step of covering the semiconductor chip disposed in the cavity of the substrate with a cover, and forming a protrusion having a height from the surface of the substrate greater than the thickness of the wiring layer in a part of the surface of the cover; and a third step of placing a printing mask for a conductive bonding material application process on the surface of the substrate, and applying a conductive bonding material through the printing mask to the wiring layer on which circuit elements are to be arranged.

Accordingly, since the printing mask slightly spaced from the surface of the substrate by the protrusions is brought into close contact with the surface of the substrate when printing the bonding material on the substrate, the printed bonding material can be prevented from separating from the substrate together with the printing mask. Therefore, the circuit elements can be surely bonded to the wiring lines, the yield rate can be improved and the highly reliable semiconductor device can be manufactured at low costs.

Further, the protrusion is formed at a part near the brim of the cavity of the substrate.

Accordingly, the potting material having a low viscosity can be used and the semiconductor chip can be effectively covered with the potting material in a short time. Consequently, time necessary for manufacturing the semiconductor device can be reduced and manufacturing costs can be reduced. Thus, the highly reliable semiconductor device can be manufactured at low costs.

Further, the protrusion is formed in a central part of the cavity of the substrate.

Accordingly, since the protrusions may be comparatively high, the bonding material can be satisfactorily printed even if the respective heights of the protrusions are distributed in a certain range, and hence the yield rate of the process of manufacturing the semiconductor devices can be improved.

Furthermore, the cover has a base part formed of a first potting material, and an upper part formed of a second potting material, and the protrusion is formed of the second potting material forming the upper part.

Accordingly, since the first and the second potting material respectively having different fluidities can be used, the semiconductor chip can be effectively covered and the height of the protrusion can be easily adjusted. Thus, the semiconductor chip can be effectively covered in a short time, the formation of the protrusions can be satisfactorily controlled, and the bonding material can be satisfactorily printed.

Still further, the semiconductor device fabricating method further includes a step of forming a second protrusion having a surface smoother than the surface of the substrate on the surface of the substrate so as to form at a part near the brim of the cavity of the substrate to be executed prior to covering the semiconductor chip with the cover.

Accordingly, the protrusions can be easily formed in a uniform height at a predetermined position on the brim of the cavity of the substrate. Consequently, the bonding material can be satisfactorily and stably printed and hence the yield rate of the process of manufacturing the semiconductor devices can be improved.

A semiconductor device fabricating method according to the present invention includes: a first step of preparing a substrate provided with a wiring layer on its surface, and a cavity, and disposing a semiconductor chip in the cavity; a second step of covering the semiconductor chip disposed in the cavity of the substrate with a cover; a third step of placing a printing mask for a conductive bonding material application process on the surface of the substrate, and applying a conductive bonding material through the printing mask to the wiring layer on which circuit elements are to be arranged; and a step of forming a protrusion in the vicinity of the wiring layer on which the circuit elements are to be arranged prior to applying the conductive bonding material to the wiring layer.

Accordingly, since the protrusion can be formed near a part to which the bonding material is to be applied regardless of the position of the cavity, the bonding material can be satisfactorily printed, the degree of freedom of laying out the chips and wiring lines can be increased, and the semiconductor devices having satisfactory electrical characteristics can be manufactured at a high yield rate.

A semiconductor device fabricating method according to the present invention includes: a first step of preparing a substrate provided with a wiring layer on its surface, and a cavity, and disposing a semiconductor chip in the cavity; a second step of covering the semiconductor chip disposed in the cavity of the substrate with a cover; and a third step of placing a printing mask having a masking film provided with openings through which a bonding material is to be applied to parts of the surface of the substrate, and protrusions formed in parts near the openings of the masking film of a surface of the masking film facing the substrate, and applying the conductive bonding material through the printing mask to the wiring layer on which circuit elements are to be placed.

A printing mask according to the present invention comprises: a masking film provided with openings through which a conductive bonding material is to be applied to a surface of a substrate; and protrusions formed in parts near the openings of the masking film of a surface of the masking film facing the substrate.

Accordingly, the bonding material can be surely printed on the surface of the substrate even if the areas of the openings of the mask body are small. Thus, the semiconductor devices can be easily manufactured at a high yield rate, using the printing mask of the present invention.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor device comprising:

a substrate including a surface on which a first wiring layer is disposed and a cavity extending into the substrate from the surface;

a semiconductor chip disposed in the cavity in the substrate;

wires entirely within the cavity electrically connecting the semiconductor chip to a second wiring layer in the cavity;

a material covering the semiconductor chip and the wires in the cavity of the substrate, the material having a surface partially within the cavity and recessed with respect to the surface of the substrate and partially protruding beyond the surface of the substrate at a protrusion, the protrusion protruding by a distance, relative to the surface of the substrate, larger than the thickness of the first wiring layer; and circuit elements bonded to the first wiring layer with a conductive bonding material.

2. The semiconductor device according to claim 1, wherein the protrusion of the material is located near an edge of the cavity in the substrate.

3. The semiconductor device according to claim 2 further comprising at least one element having a surface smoother than the surface of the substrate, located on the surface of the substrate near an edge of the cavity in the substrate, and at least partially covered by the material.

4. The semiconductor device according to claim 1, wherein the protrusion of the material is located in a central part of the cavity in the substrate.

5. The semiconductor device according to claim 4, wherein the material has a base part of a first potting material, and an upper part of a second potting material, the second potting material being disposed on the first potting material in the cavity in the substrate, and the first protrusion is composed of the second potting material.

6. The semiconductor device according to claim 1, wherein the semiconductor chip is entirely disposed within the cavity.

* * * * *

UNITED STATES PATENT AND TRADEMARK OFFICE
CERTIFICATE OF CORRECTION

PATENT NO.    : 6,822,339 B2
DATED         : November 23, 2004
INVENTOR(S)   : Shigeki Kageyama It is certified that error appears in the above-identified patent and that said Letters Patent is hereby corrected as shown below:

Title page,
Item [57], ABSTRACT,
Lines 1 and 7, replace "multiplayer" with -- multilayer --.

Signed and Sealed this

First Day of March, 2005

JON W. DUDAS
*Director of the United States Patent and Trademark Office*